United States Patent
Dror

(10) Patent No.: US 9,244,765 B2
(45) Date of Patent: Jan. 26, 2016

(54) PARALLELIZATION OF ERROR ANALYSIS CIRCUITRY FOR REDUCED POWER CONSUMPTION

(75) Inventor: Itai Dror, Omer (IL)

(73) Assignee: SanDisk IL Ltd., Kfar Saba (IL)

(*) Notice: Subject to any disclaimer, the term of this patent is extended or adjusted under 35 U.S.C. 154(b) by 975 days.

(21) Appl. No.: 13/340,286

(22) Filed: Dec. 29, 2011

(65) Prior Publication Data

US 2012/0246526 A1 Sep. 27, 2012

Related U.S. Application Data

(63) Continuation of application No. PCT/IB2011/000635, filed on Mar. 24, 2011.

(51) Int. Cl.
| | |
|---|---|
| *G06F 11/00* | (2006.01) |
| *G06F 11/10* | (2006.01) |
| *H03M 13/15* | (2006.01) |
| *H03M 13/37* | (2006.01) |
| *H03M 13/00* | (2006.01) |

(52) U.S. Cl.
CPC ....... *G06F 11/1048* (2013.01); *H03M 13/1545* (2013.01); *H03M 13/3707* (2013.01); *H03M 13/6561* (2013.01)

(58) Field of Classification Search
CPC .......... G06F 11/1048; H03M 13/6561; H03M 13/3707; H03M 13/1545
USPC .................................................. 714/704, 781
See application file for complete search history.

(56) References Cited

U.S. PATENT DOCUMENTS

| 6,021,498 A | 2/2000 | Wisor et al. |
| 6,487,692 B1 * | 11/2002 | Morelos-Zaragoza H03M 13/1525 |
| | | 714/784 |

(Continued)

FOREIGN PATENT DOCUMENTS

| CN | 1636324 | 7/2005 |
| CN | 101834616 | 9/2010 |

(Continued)

OTHER PUBLICATIONS

International Preliminary Report on Patentability issued in international application No. PCT/IB2011/000635, dated Sep. 24, 2013 (6 pages).

(Continued)

*Primary Examiner* — Guy Lamarre
(74) *Attorney, Agent, or Firm* — Brinks Gilson & Lione

(57) ABSTRACT

A memory device (e.g., a flash memory device) includes power efficient codeword error analysis circuitry. The circuitry analyzes codewords stored in the memory of the memory device to locate and correct errors in the codewords before the codewords are communicated to a host device that requests the codewords from the memory device. The circuitry includes a highly parallel configuration with reduced complexity (e.g., reduced gate count) that a controller may cause to perform the error analysis under most circumstances. The circuitry also includes an analysis section of greater complexity with a less parallel configuration that the controller may cause to perform the error analysis less frequently. Because the more complex analysis section runs less frequently, the error analysis circuitry may provide significant power consumption savings in comparison to prior designs for error analysis circuitry.

28 Claims, 8 Drawing Sheets

(56) References Cited

U.S. PATENT DOCUMENTS

| | | | |
|---|---|---|---|
| 6,560,747 B1 * | 5/2003 | Weng | G11B 20/1816 714/704 |
| 6,802,033 B1 | 10/2004 | Bertin et al. | |
| 2003/0101406 A1 | 5/2003 | Song | |
| 2003/0115420 A1 | 6/2003 | Tsirigotis et al. | |
| 2003/0155420 A1 | 8/2003 | Morrow et al. | |
| 2003/0166399 A1 | 9/2003 | Tokkonen et al. | |
| 2004/0122873 A1 | 6/2004 | Wright, Jr. et al. | |
| 2004/0205426 A1 | 10/2004 | Muranaka et al. | |
| 2006/0020869 A1 * | 1/2006 | Desai | H03M 13/3784 714/752 |
| 2006/0168403 A1 | 7/2006 | Kolovson | |
| 2007/0198903 A1 | 8/2007 | McGinnis et al. | |
| 2009/0019264 A1 | 1/2009 | Correale, Jr. et al. | |
| 2010/0131831 A1 | 5/2010 | Weingarten et al. | |
| 2010/0205513 A1 | 8/2010 | Hou et al. | |
| 2011/0022872 A1 | 1/2011 | Blancha et al. | |
| 2012/0137152 A1 | 5/2012 | Dror et al. | |

FOREIGN PATENT DOCUMENTS

| | | | | |
|---|---|---|---|---|
| WO | 2006/013529 A1 | 2/2006 | | |
| WO | 2009/072105 A2 | 6/2009 | | |
| WO | 2009/074979 A2 | 6/2009 | | |
| WO | WO2009072105 A2 * | 6/2009 | | G06F 12/02 |
| WO | 2009/110124 A1 | 9/2009 | | |

OTHER PUBLICATIONS

International Preliminary Report on Patentability issued in international application No. PCT/US2011/047047, dated Feb. 19, 2013 (7 pages).

International Preliminary Report on Patentability issued in international application No. PCT/US2011/022872, mailed Jun. 4, 2013 (7 pages).

International Search Report issued in international application No. PCT/IB2011/000635, dated Oct. 10, 2011 (4 pages).

Liu, K.J. Ray et al., Algorithm-Based Low-Power and High-Performance Multimedia Signal Processing, Proceedings of the IEEE, vol. 86, No. 6, Jun. 1998 (48 pages).

Office Action issued in U.S. Appl. No. 13/313,669, mailed on Aug. 9, 2013 (11 pages).

Search Report issued in international application No. PCT/US2011/047047, mailed May 8, 2012 (4 pages).

Vanberkel, Kees et al., A Single-Rail Re-implementation of a DCC Error Detector Using a Generic Standard-Cell Library, © 1995 IEEE (8 pages).

Wong, Shu-Yi et al., Power-Management-Based Chien Search for Low Power BCH Decoder, ISLPED '09, Aug. 19-21, 2009 (4 pages).

Written Opinion issued in international application No. PCT/IB2011/000635, dated Oct. 10, 2011 (5 pages).

Written Opinion issued in international application No. PCT/US2011/047047, dated Feb. 19, 2013 (6 pages).

Translated Office Action and Search Report for Chinese Application No. 201180070667.3 dated Sep. 15, 2015.

* cited by examiner

PARALLELIZATION OF ERROR ANALYSIS CIRCUITRY FOR REDUCED POWER CONSUMPTION

CROSS-REFERENCE TO RELATED APPLICATION

This application is a continuation of PCT Application No. PCT/IB2011/000635, filed Mar. 24, 2011, which is hereby incorporated by reference herein.

BACKGROUND OF THE INVENTION

1. Technical Field

This disclosure relates to error detection and correction of data stored in, for example memory devices employing, for example, flash memory. In particular, this disclosure relates to reducing the power consumption of error analysis circuitry in memory devices without substantially impacting error analysis performance.

2. Related Art

Continual development and rapid improvement in semiconductor manufacturing techniques have led to extremely high density memory devices. The memory devices are available in a wide range of types, speeds, and functionality. Memory devices often take the forms, as examples, of flash memory cards and flash memory drives. Today, capacities for memory devices have reached 64 gigabytes or more for portable memory devices such as Universal Serial Bus (USB) flash drives and one terabyte or more for solid state disk drives. Memory devices form a critical part of the data storage subsystem for digital cameras, digital media players, home computers, and an entire range of other host devices.

One important characteristic of a memory device is its power consumption. In an age when many host devices are powered by limited capacity batteries, every fraction of a watt in power saving translates into extended battery life and extended functionality between recharges for the host device. Reliability and cost are also important characteristics of a memory device. Significant volumes of memory devices are manufactured and sold each year, and competitive pressures have resulted in very low cost and even lower margins. Accordingly, even small improvements in the cost of a memory device can yield significant financial and marketplace position benefits. At the same time, low cost cannot be achieved at the expense of reliability. Instead, consumers expect that their memory devices will store their data for extended periods of time without significant risk of data loss.

SUMMARY

A memory device (e.g., a flash memory device) includes power efficient error analysis circuitry. The circuitry analyzes codewords stored in the memory of the memory device to locate and correct errors in the codewords before they are provided to a host device that requests them from the memory. The circuitry includes a highly parallel analysis section with reduced power consumption that a controller may cause to perform the error analysis under most circumstances. The circuitry also includes an analysis section with a less parallel configuration and greater power consumption that the controller may cause to perform the error analysis less frequently. Because the less parallel analysis section runs less frequently, the error analysis circuitry may provide significant power consumption savings in comparison to prior designs.

In one implementation, the memory device includes an error search section configured to test for errors in a codeword under analysis. The error search section includes a low parallelization circuit configuration that evaluates 'r' instances of an error locator test in parallel. The error search section also includes a high parallelization circuit configuration that evaluates 's' instances of the error locator test in parallel, where 'r'<'s'. A controller in communication with the error search section is configured to obtain an error count for the codeword under analysis. When the error count exceeds a parallelization threshold, the memory device searches for the errors with the low parallelization circuit configuration. However, when the error count does not exceed the parallelization threshold, the memory device searches for the errors with the high parallelization circuit configuration. The parallelization threshold may be set such that the high parallelization (lower power consuming) circuit configuration performs the search in most cases.

Other features and advantages of the inventions will become apparent upon examination of the following figures, detailed description, and claims.

BRIEF DESCRIPTION OF THE DRAWINGS

The system may be better understood with reference to the following drawings and description. In the figures, like reference numerals designate corresponding parts throughout the different views.

DETAILED DESCRIPTION OF THE PREFERRED EMBODIMENTS

The discussion below makes reference to host devices and memory devices. A host device may be a wired or wireless device, may be portable or relatively stationary, and may run from battery power, AC power, or another power source. A host device may be a consumer electronic device such as a personal computer, a mobile phone handset, a game device, a personal digital assistant (PDA), an email/text messaging device, a digital camera, a digital media/content player, a GPS navigation device, a satellite signal (e.g., television signal) receiver, or cable signal (e.g., television signal) receiver. In some cases, a host device accepts or interfaces to a memory device that includes the functionality described below. Examples of memory devices include memory cards, flash drives, and solid state disk drives. For example, a music/video player may accept a memory card that incorporates the functionality described below, or a personal computer may interface to a solid state disk drive that includes the functionality described below. In other cases, the host device may directly incorporate the logic that implements the functionality described below, for example as part of its memory system.

Figure 1:
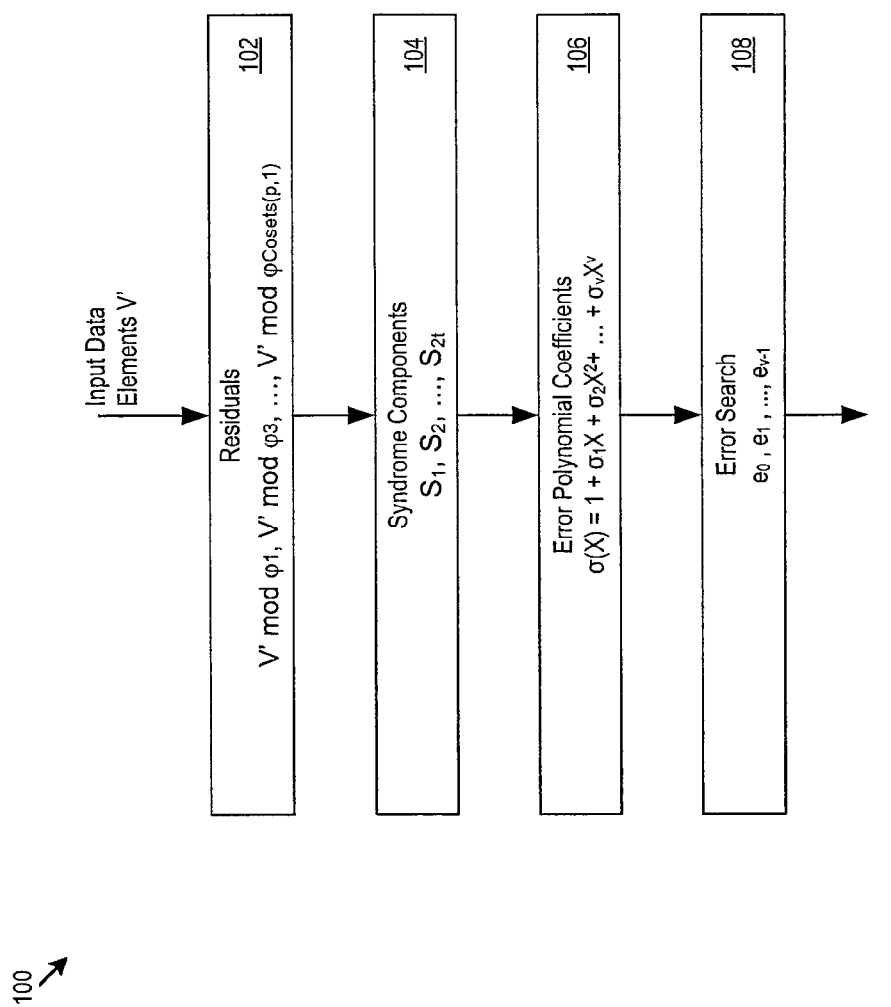
FIG. 1 illustrates prior art error decoding logic.

FIG. 1 illustrates prior art error decoding logic 100 that may be present in a host device or a memory device. In particular, the error decoding logic 100 is a block diagram of the functionality of a Bose, Chaudhuri, and Hocquenghem (BCH) error decoder. The innovations described in this application are not limited to BCH decoders, but may instead be applied to any error detection or correction logic, including Reed-Solomon decoders, turbo decoders, low density parity check decoders, and other error detection or correction logic that operates on data elements such as codewords that are members of a particular code design.

The error decoding logic 100 is partitioned into four stages 102, 104, 106, and 108. A possibly corrupted data element V' is submitted, word by word, to the first stage 102. The first stage 102 determines 'p' residuals, from the input data element with respect to 'p' minimal polynomials, $\phi_i$. The 'p' residuals are submitted to the second stage 104, which calculates the '2t' syndrome components from the 'p' residuals calculated at the first stage 102, where 't' is the maximum number of correctable errors supported by the decoder. The third stage 106 calculates the coefficients of the error location polynomial from the '2t' syndrome components that were determined by the second stage 104. The third stage 106 may employ, for example, the Berlekamp-Massey method to solve for the coefficients. The outputs of the third stage 106 are the 'v' coefficients of the error locator polynomial, where 'v' is the number of errors determined to be present in the input data element V'. The fourth stage 108 locates the 'v' errors in the input data element V' by solving the error locator polynomial. The fourth stage 108 may be implemented as Chien search logic, for example, that outputs the additive inverses of the error locations.

The Chien search circuit in the fourth stage 108 may find the bit addresses of the 'v' errors by locating the zeros, 'e', of the error location polynomial. The third stage 106 outputs the number of errors found, 'v', in the input data element V', and the 'v' coefficients $\sigma_i$ of the error locator polynomial. These parameters are input to the Chien search logic.

Figure 2:
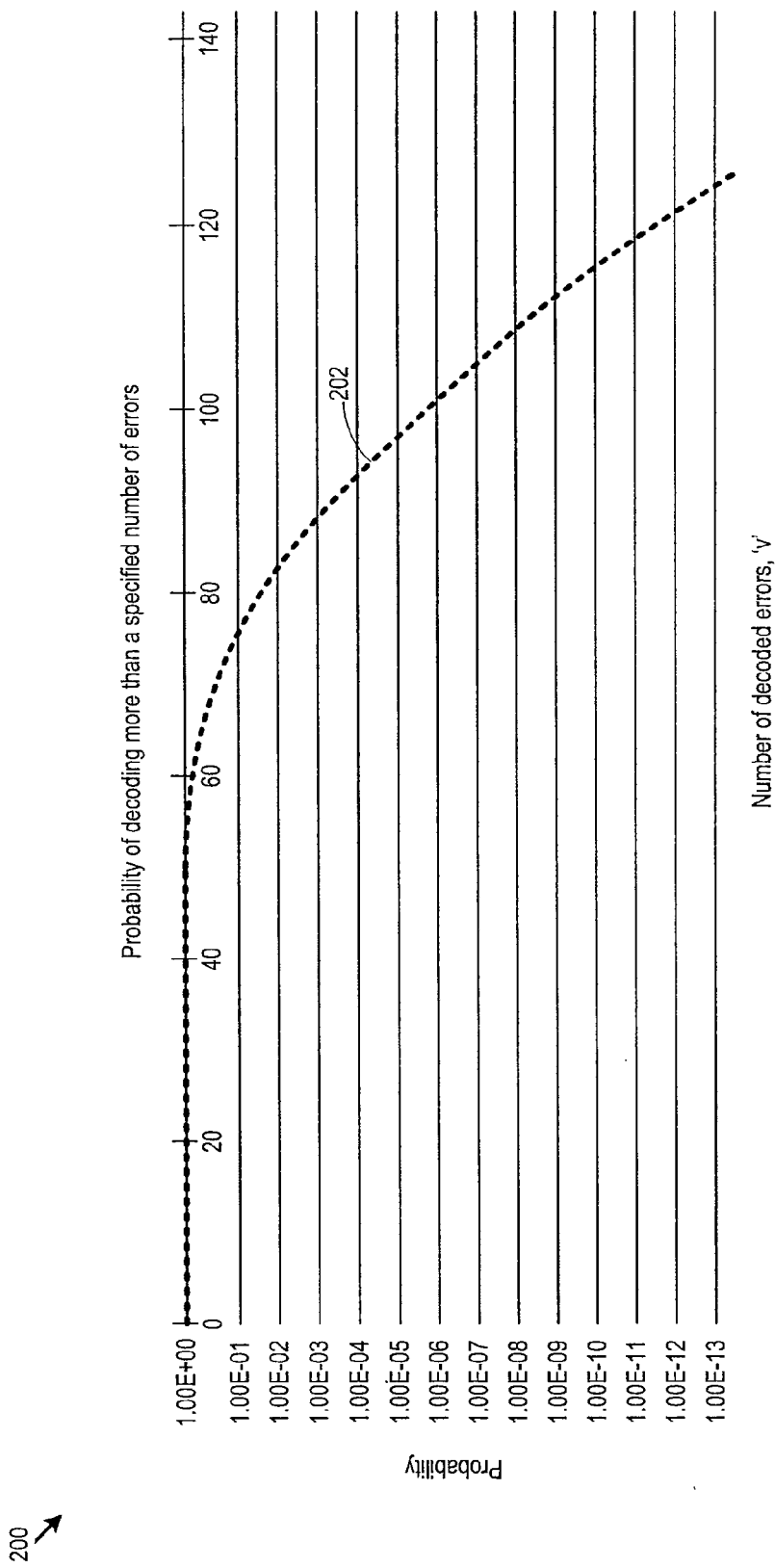
FIG. 2 shows a probability curve of the probability of decoding more than a specified number of errors in a code word.

FIG. 2 shows an example plot 200 that gives the probability 202 that a data element (e.g., a codeword from a predefined code) will have more than a specified number of errors. For the purposes of illustration, the plot 200 assumes a predefined BCH(18214, 16384, 245) code that corrects up to 122 errors in a codeword, and a bit error rate of 0.34%. The BCH(18214, 16384, 245) code specifies that each codeword will have 18,214 bits, of which 16,384 are data bits (e.g., a block of 2048 8-bit bytes of user data), and that there is a minimum Hamming distance of 245 between code words. Other such plots may be generated for any particular code design and bit error rate, and the data elements input to the error detection or correction logic may be codewords from any desired code design.

The plot 200 shows, for example, that there is less than a $1/1000$ chance of the codeword having more than 88 errors. The probability for a given number of errors drops precipitously as the number of errors increases toward 't', the maximum error correcting capability of the code. Although it is rare to have a large number of errors in the data element, the power supply needs to be designed to accommodate the power needed to correct these large numbers of errors because they do sometimes occur.

The following description presents several techniques for reducing the maximum power consumption of error decoding logic. In one aspect, the memory device searches for errors in the codeword using search circuitry with different degrees of parallelization and complexity. The search circuitry chosen may depend on the number of errors, 'v', detected in the codeword in comparison against a power control threshold. The power control threshold may be a constant, or may be changed during the operation of the device that includes the error decoding logic.

For example, when 'v' is greater than a power control threshold number of errors, the memory device may search for errors using a low parallelization circuit having a particular complexity. The complexity may be expressed in terms of power consumption, gate count (which may translate directly or indirectly to power consumption), or other complexity measure. When 'v' is less than a power control threshold number of errors, the memory device may instead search for errors using a high parallelization circuit having reduced complexity compared to the low parallelization circuit. In the implementations described below, the high parallelization circuit has a lower gate count and lower power consumption than the low parallelization circuit. As a result, the memory device detects and corrects a large number of errors (which occur infrequently) by employing lower parallelization, higher complexity circuits less frequently than the higher parallelization, low complexity circuits. As a result, the memory device benefits during most decoding operations from decreased the maximum sustained power consumption of the error decoding logic.

The power control threshold at which the lower complexity circuits perform the search may be set at any level. In some implementations, the power control threshold may be set to correspond to a desired probability that fewer than the threshold number of errors will occur. The power control threshold may thereby determine a pre-selected probability for which the low complexity circuits perform the search, and may thereby implement an expected pre-selected power consumption reduction for the memory device. As a specific example, using the code design given above, the power control threshold may be set to 88, so that there is only a $1/1000$ chance that the higher complexity circuits perform the search for any given codeword. As a result, the error decoding logic searches using the lower complexity, higher parallelization circuits, 999 times out of 1000, so that the overall performance of the memory device remains nearly unaffected. At the same time, less power is consumed 999 times out of 1000, according to the difference in power consumption between the lower complexity and higher complexity circuits.

The reduced power requirements may give rise to less expensive or less complex power supplies, thereby reducing the cost and increasing the reliability of the electronic device that incorporates these control techniques. This is particularly true in implementations where the memory controller and the power supply are fabricated monolithically (e.g., on a single chip). In such implementations, the power supply relies on internal chip capacitance to avoid the expense and space required for discrete capacitors, but at the same time the power supply tends to be limited in peak power output, rise and fall time, and other parameters. Accordingly, reducing the power required from the power supply facilitates low cost and reliable fabrication and operation of memory devices that incorporate the power supply, e.g., on a single chip.

Figure 3:
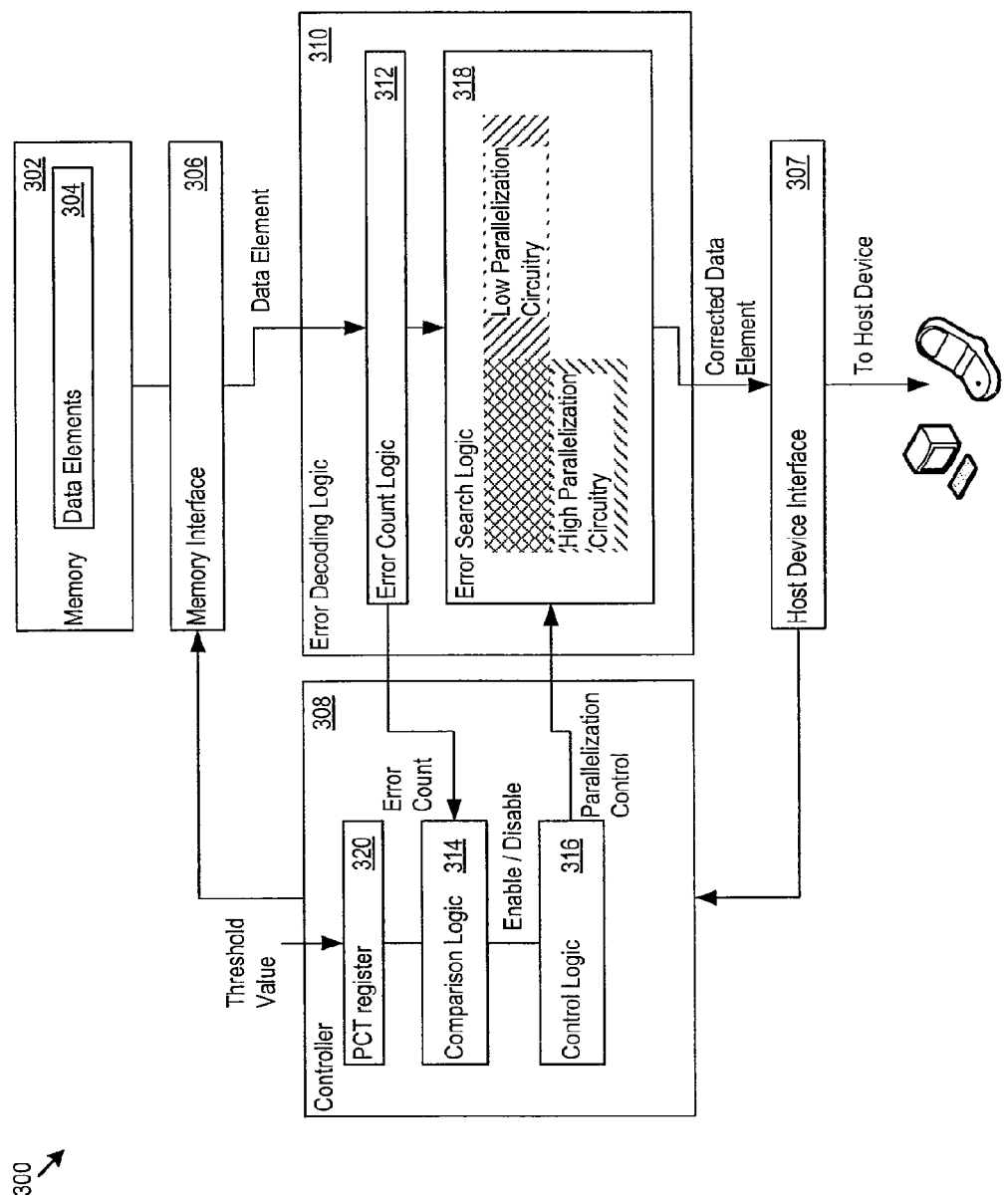
FIG. 3 illustrates a memory device that includes power efficient codeword error analysis circuitry.

FIG. 3 shows a memory device 300 in which a memory 302 stores data elements 304 that a memory interface 306 stores and retrieves. In particular, the controller 308 and memory interface 306 retrieve data elements requested by the host device and communicate them first to the error decoding logic 310 for error detection and correction. As one example, the memory 302 may be a flash memory card memory array, and the memory interface 306 may respond to read requests from a host device by retrieving the requested data elements from the memory 302 and passing them to the error decoding logic 310. After error detection and correction, the corrected data elements may then be communicated to the host device through the host device interface 307 (e.g., a Secure Digital (SD), micro SD, Compact Flash, or other flash memory card interface).

The error decoding logic 310 includes error count logic 312 (e.g., the Berlekamp-Massey coefficient solver noted above with respect to FIG. 1) that determines an error count, 'v', for the data element. The comparison logic 314 in the controller 308 receives the error count and determines when the error count exceeds a power control threshold (PCT). The PCT value may be stored in the PCT register 320. If the error count exceeds the power control threshold, the comparison logic 314 may, as examples, assert a power control enable signal or status bit, or communicate a power control message or command to the control logic 316. The control logic 316 asserts the parallelization control signals to the error search logic 318 to selectively cause a search for the 'v' errors to be performed by the high parallelization, low complexity circuitry or by the low parallelization, high complexity circuitry.

In one implementation, the error search logic 318 performs a Chien search to find the roots of a polynomial over a finite field GF(q):

$$\Lambda(x) = \lambda_0 + \lambda_1 x + \lambda_2 x^2 + \ldots + \lambda_t x^t$$

the nonzero $\beta$ in GF(q) for which $\Lambda(\beta)=0$ are the roots of the polynomial.

The implementation of a Chien search is made more efficient because each non-zero $\beta$ may be expressed as $\alpha^{i_\beta}$ for a selected $i_\beta$, where $\alpha$ is a primitive element of GF(q). Therefore, $\alpha^i$ from 'i' between 0 and q−1 cover the entire field (other than the zero element).

There is this relationship between instances 'i' and 'i+1' of the polynomial:

$$\Lambda(\alpha^i) = \lambda_0 + \lambda_1(\alpha^i) + \lambda_2(\alpha^i)^2 + \ldots + \lambda_t(\alpha^i)^t$$
$$\stackrel{\Delta}{=} \gamma_{0,i} + \gamma_{1,i} + \gamma_{2,i} + \ldots + \gamma_{t,i}$$
$$\Lambda(\alpha^{i+1}) = \lambda_0 + \lambda_1(\alpha^{i+1}) + \lambda_2(\alpha^{i+1})^2 + \ldots + \lambda_t(\alpha^{i+1})^t$$
$$= \lambda_0 + \lambda_1(\alpha^i)\alpha + \lambda_2(\alpha^i)^2\alpha^2 + \ldots + \lambda_t(\alpha^i)^t\alpha^t$$
$$= \gamma_{0,i} + \gamma_{1,i}\alpha + \gamma_{2,i}\alpha^2 + \ldots + \gamma_{t,i}\alpha^t$$
$$\stackrel{\Delta}{=} \gamma_{0,i+1} + \gamma_{1,i+1} + \gamma_{2,i+1} + \ldots + \gamma_{t,i+1}$$

Each $\Lambda(\alpha^i)$ is therefore the sum of the terms $\{\gamma_{j,i} | 0 \leq j \leq t\}$ in the polynomial, from which the next set of coefficients for each term in the polynomial are given by:

$$\gamma_{j,i+1} = \gamma_{j,i}\alpha^j$$

The Chien search starts at i=0 with $\gamma_{j,0}=\lambda_j$, and iterates through each value of i up to (q−1). As described in more detail below, each iteration may cover 'r' instances ('r' values of 'i') of the polynomial for the low parallelization configuration, or 's' instances ('s' values of 'i') of the polynomial for the high parallelization configuration, with 's'>'r'. If the sum of the terms in any instance of a polynomial is zero, then a root of the polynomial had been located, and an error exists in the codeword at position 'i'.

Figure 4:
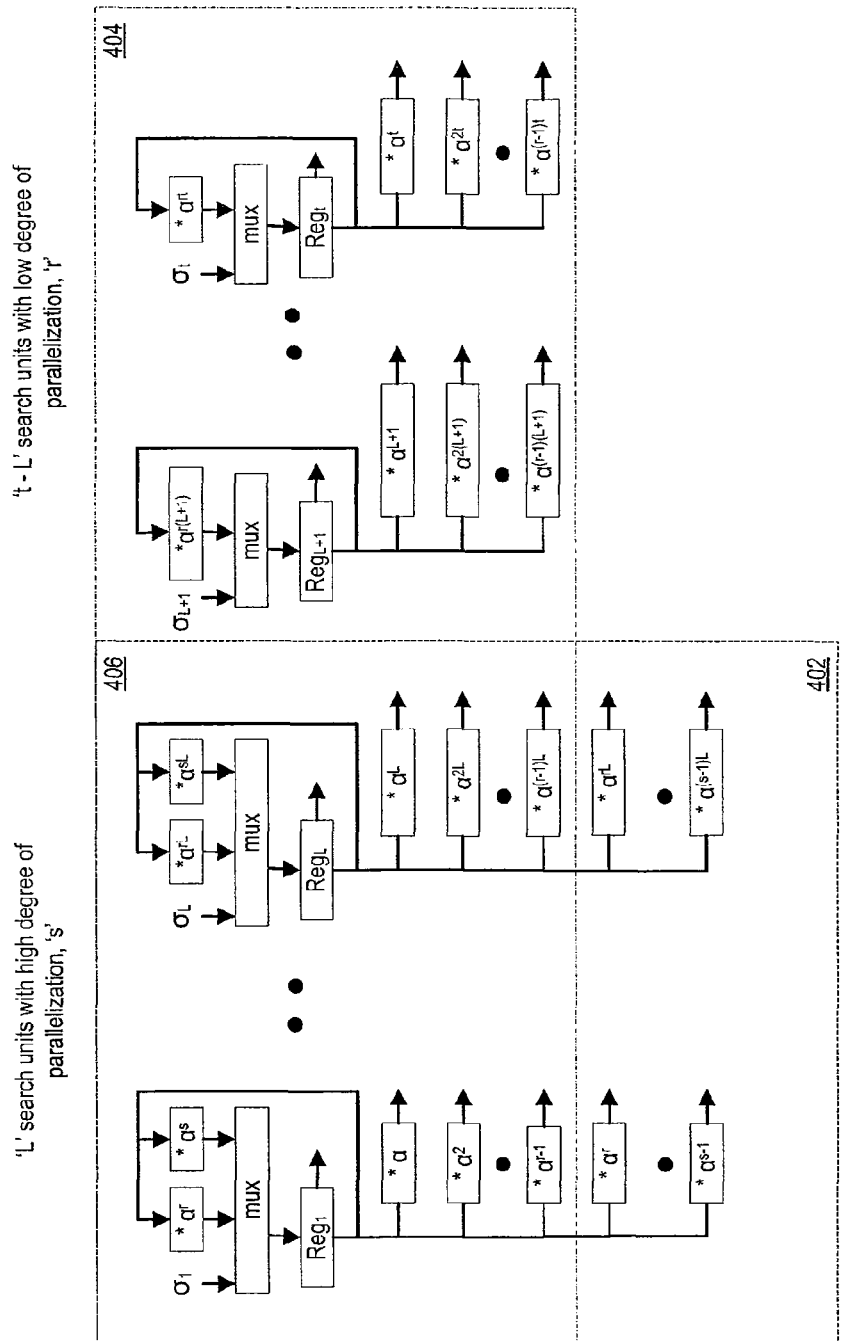
FIG. 4 shows high parallelization and low parallelization search circuitry.
Figure 5:
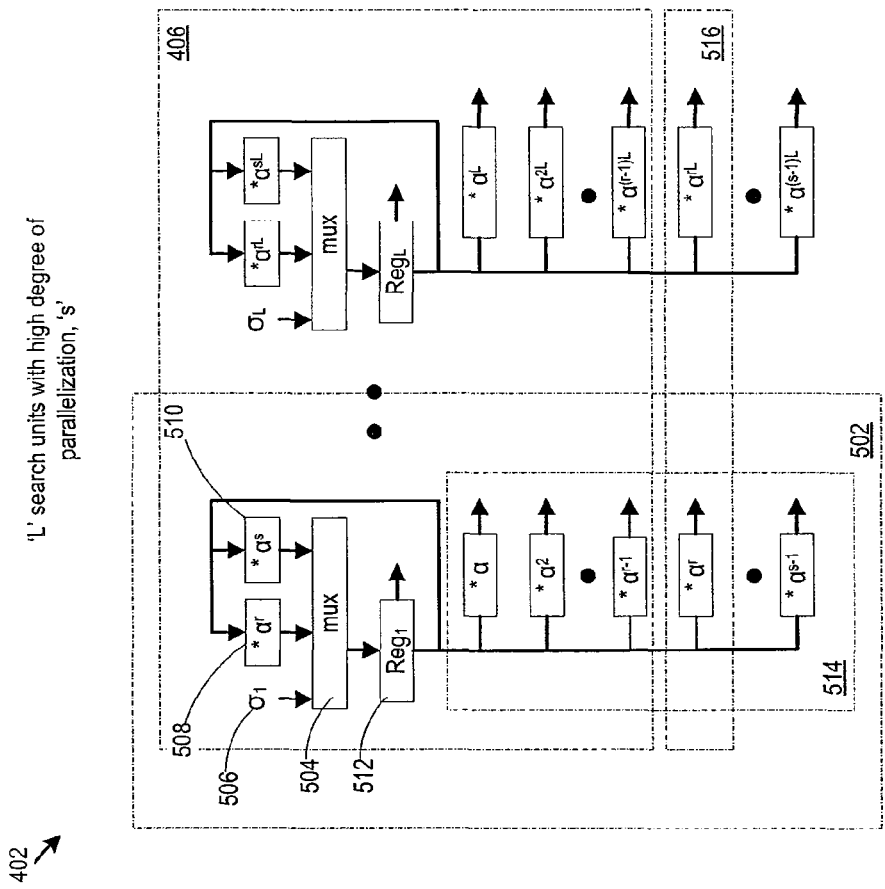
FIG. 5 shows search units for high parallelization search circuitry.
Figure 6:
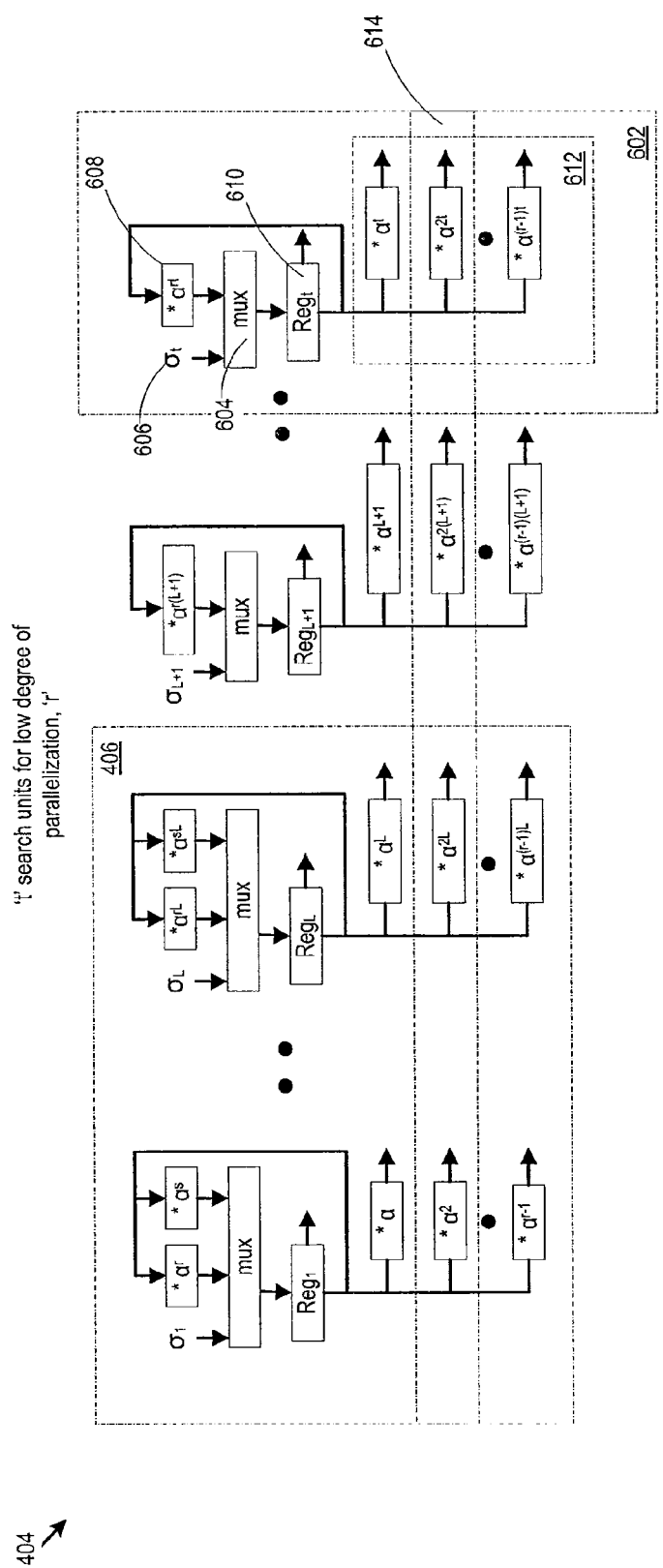
FIG. 6 shows search units for low parallelization search circuitry.

FIG. 4 shows an example of the error search logic 318, including a high parallelization circuit 402 and low parallelization circuit 404. The high parallelization circuit 402 overlaps in circuitry with the low parallelization circuitry 404 as shown by the overlap 406. FIG. 5 isolates a view of the high parallelization circuitry 402, while FIG. 6 isolates a view of the low parallelization circuitry 404.

The following parameters characterize the implementations: 'L' is the power control threshold, 's' is the number of instances of the polynomial evaluated in parallel for the high parallelization circuitry, 'r' is the number of instances of the polynomial evaluated in parallel for the low parallelization circuitry, and 't' is the number of errors that may be corrected in the codeword as determined by the code design. Furthermore, in FIG. 4-6, the '$\sigma_i$' are the coefficients of the polynomial determined in an earlier stage of the error decoding logic 310, and '$\alpha$' are the multipliers raised to the correct powers for each term in the polynomial and for each instance of the polynomial according to the equations above. Note that the error decoding process described in FIG. 1 that feeds the error search logic 318 has the property that $\sigma_i=0$ for 'i'>'v'.

As noted above, the total number of instances of the polynomial to evaluate is q−1. The value of 'r' is less than the value of 's', and therefore it takes more iterations of the low parallelization circuitry 404 to evaluate the total number of instances of the polynomial. This is one sense in which the low parallelization circuitry has a lesser degree of parallelization than the high parallelization circuitry. Note that the values of 's' and 'r' and 'L' are selected such that the low parallelization circuitry has a higher power consumption than the high parallelization circuitry. In part, the higher power consumption results from the additional multipliers employed in the low parallelization circuitry to evaluate the polynomial across all 't' term positions. In contrast, the high parallelization circuitry uses fewer multipliers to evaluate the polynomial across 'L' term positions, when 'v'<='L', taking advantage of $\sigma_i=0$ for 'i'>'v'.

The search logic 318 may be implemented using search units. FIG. 5 shows an example of a search unit 502 for the high parallelization circuitry 402. There are 'L' such search units for the high parallelization circuitry. Each search unit may evaluate a specific term position of the polynomial for multiple instances (e.g., 's' instances) of the polynomial.

The search unit 502 includes a multiplexer 504 that selects between three inputs: the polynomial coefficient '$\sigma_i$' 506 for the first iteration of evaluation of a set of 's' or 'r' polynomials, a multiplication of the prior coefficient (stored in the register 512) for the term position by a power of '$\alpha^s$' 508 which multiplies the polynomial coefficients by the requisite powers of '$\alpha^s$' when 's' instances of the polynomial are evaluated each iteration in high parallelization mode, and a multiplication of the prior coefficient for the term position by a power of '$\alpha^r$' 510 which multiplies the polynomial coefficients by the requisite powers of '$\alpha^r$' when 'r' instances of the polynomial are evaluated each iteration in low parallelization mode.

The search units that overlap between the high parallelization circuitry 402 and the low parallelization circuitry 404 are configurable to act in a low parallelization mode or a high parallelization mode by controlling the multiplexers. In particular, the multiplexers 504 select multiplication by powers of '$\alpha^r$' for low parallelization mode, and multiplication by powers of '$\alpha^s$' for high parallelization mode. In one implementation, the control logic 316 generates the parallelization control signals to cause the multiplexers 504 to select the appropriate parameters for the selected parallelization mode.

The search unit 502 further includes a set of 's' coefficient multipliers 514. The coefficient multipliers 514 multiply the coefficient for a specific term position by an additional power of '$\alpha$' to evaluate the specific term position of the polynomial for different instances of the polynomial. No additional multiplication is needed for the first instance of the polynomial, and the unmodified values of the registers (e.g., the register 512) are used. The 's−1' coefficient multipliers 514 evaluate the first term position for 's–1' instances of the polynomial. There are 'L' search units operating in parallel, each of which evaluates a particular term position of the polynomial for each of 's' instances of the polynomial. A horizontal slice through the high parallelization circuitry 402 evaluates one instance of the polynomial (across the first 'L' term positions). One such horizontal slice is labeled in FIG. 5 as the slice 516.

FIG. 6 shows an example of a search unit 602 for the low parallelization circuitry 404. There are 't' search units for the low parallelization circuitry 404, and each search unit may evaluate a specific term position of the polynomial for multiple instances (e.g., 'r' instances) of the polynomial. Among the search units, 'L' are shared with the high parallelization circuitry 402 and have the form described above with regard to the search unit 502. The remaining 't–L' search units have a slightly different form, and the last such search unit is designated by element 602 in FIG. 6.

The search unit 602 includes a multiplexer 604 that selects between two inputs: the polynomial coefficient '$\sigma_i$' 606 for the first iteration of evaluation of a set of 'r' polynomials, and a multiplication of the prior coefficient (stored in the register 610) for the term position by powers of '$\alpha^r$' 608 which multiplies the polynomial coefficient by the requisite powers of '$\alpha^r$' when 'r' instances of the polynomial are evaluated each iteration in low parallelization mode.

As noted before, the 'L' search units that overlap between the high parallelization circuitry 402 and the low parallelization circuitry 404 are configurable to act in a low parallelization mode or a high parallelization mode by controlling the multiplexers. The multiplexers 604 in the remaining 't–L' search units select '$\sigma_i$' as the coefficient for the first iteration of evaluating 'r' instances of the polynomials in parallel, and select the multiplication of the prior coefficient by powers of '$\alpha^r$' for the coefficient for subsequent iterations. In one implementation, the parallelization control signals generated by the control logic 316 control the multiplexers 604 to select inputs as noted above according to the selected operating mode.

The search unit 602 further includes a set of 'r' coefficient multipliers 612. The coefficient multipliers 612 multiply the coefficient for a specific term position by an additional power of '$\alpha$' to evaluate the specific term position of the polynomial for different instances of the polynomial. No additional multiplication is needed for the first instance of the polynomial, and the unmodified values of the registers (e.g., the register 610) are used. In particular, the 'r–1' coefficient multipliers 612 evaluate the last term position for 'r–1' instances of the polynomial. There are 't' search units operating in parallel, each of which evaluates a different one of the 't' term positions for 'r' instances of the polynomial in parallel. A horizontal slice through the low parallelization circuitry 402 evaluates one instance of the polynomial (across all 't' term positions). One such horizontal slice is labeled in FIG. 5 as the slice 614.

Figure 7:
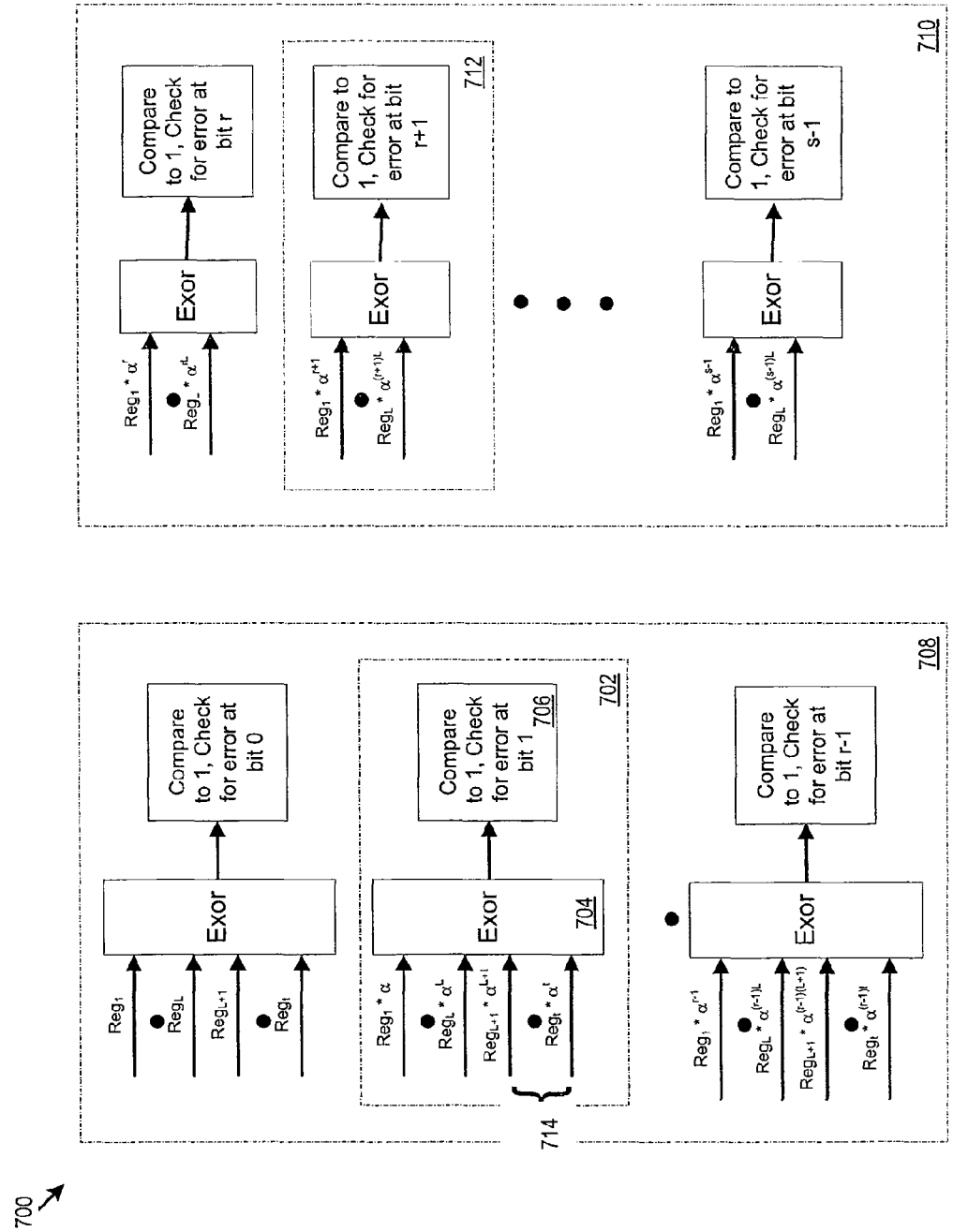
FIG. 7 shows test logic for finding errors in a codeword.

Once the term positions in the polynomial are evaluated, the error search logic 318 tests whether any instance of the polynomial, for which term positions have been evaluated, is zero (and thereby determines whether an error is located) using the test logic 700 shown in FIG. 7. One instance of the test logic is labeled 702 and it evaluates the first instance of a polynomial in each set of polynomials. The test logic 702 connects to and performs an exclusive-or operation 704 against the first output of each of the coefficient multipliers across the search units. For operation in the low parallelization mode, there are 'r' instances 708 of the test logic that each accept 't' inputs corresponding to the 't' evaluated term positions from the search units. For operation in the high parallelization mode, additional instances 710 of the test logic also operate to evaluate the additional 's–r' instances of the polynomial, for a total of 's' instances. For example, the test logic 712 determines whether the instance r+1 in any set of iterations of the polynomial is zero by analyzing the 'L' term positions evaluated by the search units in the high parallelization circuitry 402. The additional instances 710 of the test logic are not used when operating in low parallelization mode, and their outputs may be disabled or ignored.

Because $\sigma_i=0$ for 'i'>'v', and the high parallelization mode is active when 'v'<='L', the additional instances 710 of the test logic only need to accept 'L'<'t' inputs from the coefficient multipliers shown in FIG. 5. The other instances 708 of the test logic also operate in high parallelization mode, but the inputs to the exclusive-or operation are zero for any term position beyond 'L'. Thus, even though the other instances 708 of the test logic have 't' inputs, the inputs beyond 'L' (for example, the inputs labeled 714) are zero when operating in high parallelization mode and do not contribute to the analysis of any particular instance of the polynomial.

Figure 8:
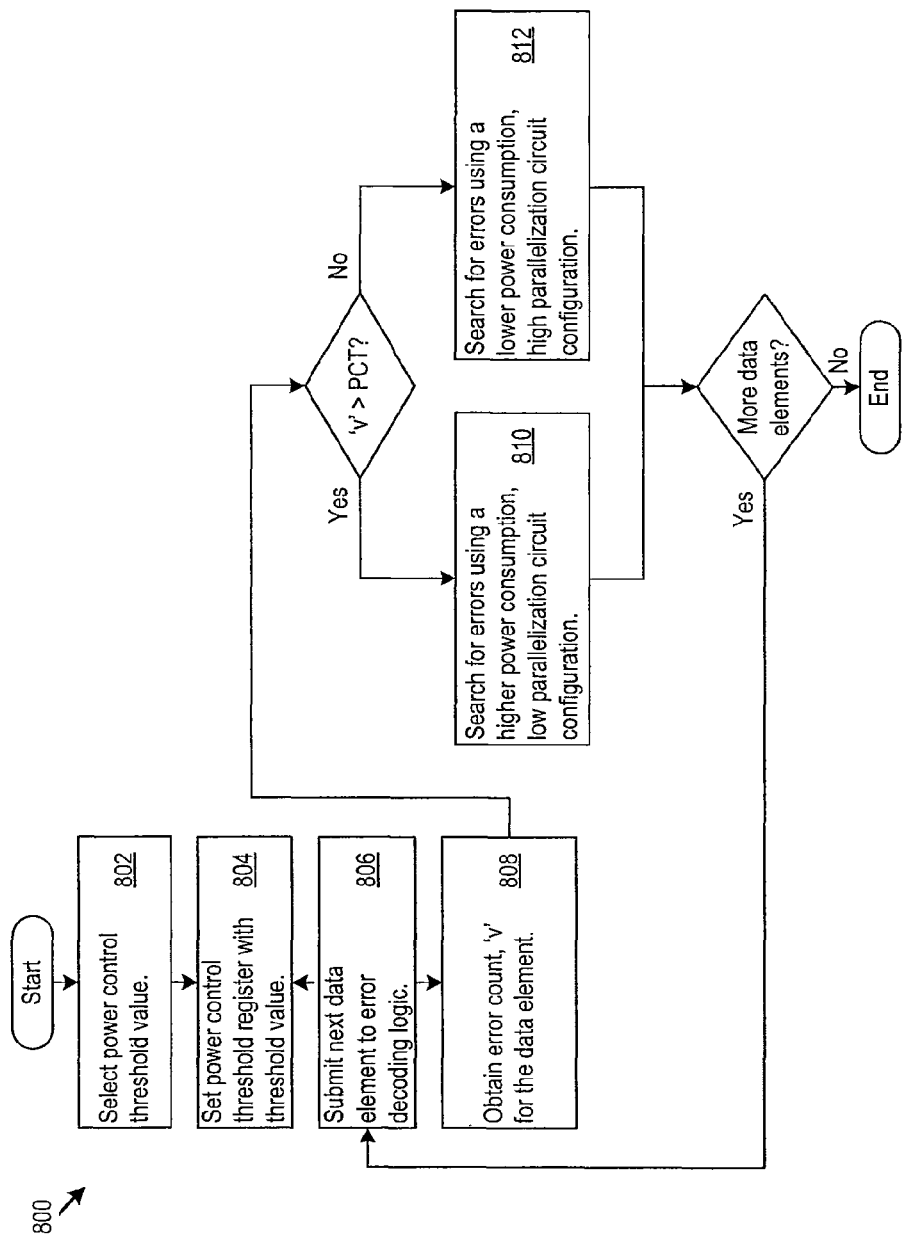
FIG. 8 shows a method for finding errors in a codeword.

FIG. 8 shows the logic 800 that a memory device may implement to selectively search for errors with different degrees of parallelization. The memory device selects a power control threshold value (802) and sets a power control threshold register with the power control threshold value (804). The power control threshold value may be fixed or may change during the operation of the memory device, and may be provided by a host device, may be set or preconfigured in the memory device, or may be set or obtained in other ways.

The memory device submits the next data element to the error decoding logic 310 (806). The error decoding logic 310 determines and provides to the controller 308 an error count 'v' for the data element (808). When the error count 'v' exceeds the power control threshold, then the controller 308 searches for errors in the data element with a low parallelization circuit configuration (e.g., using the low parallelization circuit 404) (810). The low parallelization circuit configuration evaluates 'r' instances of an error locator test (e.g., the error locator polynomial) in parallel. On the other hand, when the error count 'v' does not exceed the power control threshold, then the controller 308 searches for errors in the data element with a high parallelization circuit configuration (e.g., using the high parallelization circuit 402) (812). The high parallelization circuit configuration evaluates 's' instances of an error locator test (e.g., the error locator polynomial) in parallel, where 'r'<'s'. In general, the low parallelization circuit configuration is expected to consume more power than the high parallelization circuit configuration because, for example, the low parallelization circuit configuration has a higher gate count or complexity than the high parallelization circuit configuration.

The error locator polynomial may be configured to locate as many as 't' errors in the codeword under analysis. The low parallelization circuit configuration may evaluate 't' terms in the error locator polynomial for each of the 'r' instances of the error locator polynomial. On the other hand, the high parallelization circuit configuration evaluates 's' instances of the error locator polynomial in parallel for 'L' terms in the error locator polynomial, with 'L'<'t'.

The choice of 'L', the power control threshold, may be made to implement a pre-selected probability for which the high parallelization circuit configuration executes. For example, using the code design described above, setting 'L' to 88 implements a 999/1000 probability that the high parallelization circuit configuration executes. Because the high parallelization circuit configuration has an expected power saving compared to the low parallelization circuit configuration, the choice of 'L' may implement an expected pre-selected power consumption reduction.

The methods, power control sections, controllers, and other logic described above may be implemented in many different ways in many different combinations of hardware, software or both hardware and software. For example, the logic shown in FIGS. 3-8 may be circuitry in a controller, a microprocessor, or an application specific integrated circuit (ASIC), or may be implemented with discrete logic, or a combination of other types of circuitry. The logic may be encoded or stored in a machine-readable or computer-readable medium such as a compact disc read only memory (CDROM), magnetic or optical disk, flash memory, random access memory (RAM) or read only memory (ROM), erasable programmable read only memory (EPROM) or other machine-readable medium as, for example, instructions for execution by a processor, controller, or other processing device. Similarly, the memory that stores the data elements such as the PCT may be volatile memory, such as Dynamic Random Access Memory (DRAM) or Static Random Access Memory (SRAM), or non-volatile memory such as NAND Flash or other types of non-volatile memory, or may be combinations of different types of volatile and non-volatile memory. The instructions that comprise the software may be part of a single program, separate programs, implemented in an application programming interface (API), in libraries such as Dynamic Link Libraries (DLLs), or distributed across multiple memories and processors. The instructions may be included in firmware that a controller executes. For example, the firmware may be operational firmware for a memory card whose read/write operations are directed by a controller. The controller may execute the instructions to perform all or part of the techniques described above. For example, the instructions may perform the comparison of 'v' and 'PCT', and responsively search for errors using either the high or low parallelization circuit configuration.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. A memory device comprising:
an error search section configured to test for errors in a codeword under analysis, the error search section comprising:
a low parallelization circuit configuration that evaluates 'r' instances of an error locator test in parallel; and
a high parallelization circuit configuration that evaluates 's' instances of the error locator test in parallel;
where 'r'<'s'; and
a controller in communication with the error search section, the controller configured to:
obtain an error count for the codeword under analysis;
when the error count exceeds a parallelization threshold, search for the errors with the low parallelization circuit configuration; and
when the error count does not exceed the parallelization threshold, search for the errors with the high parallelization circuit configuration.

2. The memory device of claim 1, where the error locator test comprises an error locator polynomial.

3. The memory device of claim 2, where:
the error locator polynomial is configured to locate as many as 't' errors in the codeword under analysis; and
the low parallelization circuit configuration evaluates 't' terms in the error locator polynomial for each of the 'r' instances.

4. The memory device of claim 3, where the high parallelization circuit configuration evaluates 's' instances of the error locator polynomial in parallel for 'L' terms in the error locator polynomial.

5. The memory device of claim 4, where 'L'<'t' and 'r'<'s'.

6. The memory device of claim 4, where 'L' represents a pre-selected probability for which the high parallelization circuit configuration executes.

7. The memory device of claim 4, where 'L' represents an expected pre-selected power consumption reduction.

8. The memory device of claim 1, where the error search section comprises a Chien search section and the error locator test comprises an error locator polynomial evaluated by the low parallelization circuit configuration and the high parallelization circuit configuration.

9. The memory device of claim 8, where the error locator polynomial comprises polynomial coefficients obtained from an error processing stage prior to the error search section.

10. The memory device of claim 1, where the parallelization threshold represents an expected pre-selected power consumption reduction.

11. A memory device comprising:
an error search section configured to test for errors in a codeword under analysis, the error search section comprising:
't' search units, each configured to evaluate a specific term position of an error locator equation across 't' term positions in the error locator equation, in parallel for 'r' instances of the error locator equation;
among the 't' search units, 'L' search units further configured to evaluate their specific term position of the error locator equation across 'L' term positions in the error locator equation, in parallel for 's' instances of the error locator equation, where:
'L'<'t'; and
's'>'r'; and
a controller in communication with the error search section, the controller configured to:
obtain an error count for the codeword under analysis;
when the error count exceeds 'L', execute in the error search section a low parallelization analysis in which the 't' search units search for the errors in the codeword under analysis 'r' instances of the error locator equation at a time; and
when the error count does not exceed 'L', execute in the error search section a high parallelization analysis in which the 't' search units search for the error in the codeword under analysis 's' instances of the error locator equation at a time.

12. The memory device of claim 11, where the error search section comprises a Chien search section and the error locator equation comprises an error locator polynomial evaluated by the 't' search units.

13. The memory device of claim 12, where the error locator polynomial comprises polynomial coefficients obtained from an error processing stage prior to the error search section.

14. The memory device of claim 11, where 'L' represents a pre-selected probability for which the high parallelization analysis executes.

15. The memory device of claim 11, where 'L' represents an expected pre-selected power consumption reduction.

16. The memory device of claim 11, where the error locator equation comprises an error locator polynomial.

17. The memory device of claim 16, where the 'L' search units each comprise a multiplexer that selects between:
- an error locator polynomial coefficient for the error locator polynomial;
- an error locator polynomial coefficient multiplier for evaluating a particular iteration of 'r' instances of the error locator polynomial in parallel; and
- an error locator polynomial coefficient multiplier for evaluating a particular iteration of 's' instances of the error locator polynomial in parallel.

18. The memory device of claim 16, where the 't' search units, other than the 'L' search units, each comprise a multiplexer that selects between:
- an error locator polynomial coefficient for the error locator polynomial; and
- an error locator polynomial coefficient multiplier for evaluating a particular iteration of 'r' instances of the error locator polynomial in parallel.

19. A method for locating errors in a codeword, the method comprising:
- obtaining an error count for a codeword under analysis;
- when the error count exceeds a parallelization threshold, searching for the errors in the codeword with a low parallelization circuit configuration that evaluates 'r' instances of an error locator test in parallel; and
- when the error count does not exceed a parallelization threshold, searching for the errors in the codeword with a high parallelization circuit configuration that evaluates 's' instances of the error locator test in parallel;
- where 'r'<'s'.

20. The method of claim 19, where the error locator test comprises an error locator polynomial.

21. The method of claim 19, where searching for the errors with a low parallelization circuit configuration comprises performing a Chien search.

22. The method of claim 19, where searching for the errors with a high parallelization circuit configuration comprises performing a Chien search.

23. The method of claim 19, where:
- the error locator polynomial is configured to locate as many as 't' errors in the codeword under analysis; and
- the low parallelization circuit configuration evaluates 't' terms in the error locator polynomial for each of the 'r' instances.

24. The method of claim 23, where the high parallelization circuit configuration evaluates 's' instances of the error locator polynomial in parallel for 'L' terms in the error locator polynomial.

25. The method of claim 24, where 'L'<'t' and 'r'<'s'.

26. The method of claim 24, further comprising:
- setting 'L' to implement a pre-selected probability for which the high parallelization circuit configuration executes.

27. The method of claim 24, further comprising:
- setting 'L' to implement an expected pre-selected power consumption reduction.

28. The method of claim 19, further comprising:
- setting the parallelization threshold to implement an expected pre-selected power consumption reduction.

* * * * *